(12) United States Patent
Romero et al.

(10) Patent No.: US 10,794,947 B2
(45) Date of Patent: Oct. 6, 2020

(54) GROUND LOSS DETECTION CIRCUIT

(71) Applicants: ZF Active Safety US Inc., Livonia, MI (US); ZF Active Safety GmbH, Koblenz (DE); ZF Active Safety US Inc., Livonia (DE)

(72) Inventors: Antonio Romero, Koblenz (DE); Johannes Orth, Koblenz (DE); Erik Hermann, Koblenz (DE); William J. Lindeman, Livonia, MI (US)

(73) Assignees: ZF Active Safety US Inc., Livonia, MI (US); ZF Active Safety GmbH, Koblenz (DE); ZF Automotive Germany GmbH, Alfdorf (DE)

( * ) Notice: Subject to any disclaimer, the term of this patent is extended or adjusted under 35 U.S.C. 154(b) by 0 days.

(21) Appl. No.: 15/742,641

(22) PCT Filed: Jul. 8, 2016

(86) PCT No.: PCT/US2016/041635
§ 371 (c)(1),
(2) Date: Jan. 8, 2018

(87) PCT Pub. No.: WO2017/008057
PCT Pub. Date: Jan. 12, 2017

(65) Prior Publication Data
US 2018/0203054 A1    Jul. 19, 2018

Related U.S. Application Data

(60) Provisional application No. 62/190,068, filed on Jul. 8, 2015.

(51) Int. Cl.
*G01R 31/02*    (2006.01)
*G01R 31/00*    (2006.01)

(52) U.S. Cl.
CPC ......... *G01R 31/025* (2013.01); *G01R 31/007* (2013.01)

(58) Field of Classification Search
CPC .......................... G01R 31/025; G01R 31/007
(Continued)

(56) References Cited

U.S. PATENT DOCUMENTS

| 7,583,483 B2* | 9/2009 | Trenchs | B60L 3/0046 |
| | | | 361/42 |
| 2003/0145256 A1* | 7/2003 | Jehlicka | H02J 7/1423 |
| | | | 714/48 |

(Continued)

*Primary Examiner* — Paula L Schneider
(74) *Attorney, Agent, or Firm* — MacMillan, Sobanski & Todd, LLC

(57) ABSTRACT

A ground loss detection circuit identifies a faulty ground connection in a vehicle electrical system including a pair of redundant ground lines connected between a vehicle battery/chassis ground and an electronic control unit (ECU). In particular, a first ground line is connected between the battery/chassis ground and a first ECU ground connection, while a second ground line is connected between the battery/chassis ground location and a second ECU ground connection. The ECU includes a common ground associated with selected electronic components included in the ECU. A first shunt component is connected between the first ECU ground connection and the common ground, and a second shunt component is connected between the second ECU ground connection and the common ground. The currents through the first and second shunt components are monitored to identify a current imbalance to detect a faulty ground connection in one of the first and second ground lines.

10 Claims, 5 Drawing Sheets

(58) Field of Classification Search
USPC .......................................................... 701/29.7
See application file for complete search history.

(56) References Cited

U.S. PATENT DOCUMENTS

| | | | | |
|---|---|---|---|---|
| 2004/0243288 | A1* | 12/2004 | Kito | B60K 6/48 |
| | | | | 702/183 |
| 2005/0151559 | A1* | 7/2005 | Liao | G01R 31/025 |
| | | | | 307/64 |
| 2007/0268636 | A1* | 11/2007 | Suzuki | G01R 31/025 |
| | | | | 361/48 |
| 2010/0052419 | A1* | 3/2010 | Oosawa | B60L 3/0046 |
| | | | | 307/10.1 |
| 2014/0347769 | A1* | 11/2014 | Kanda | H01M 10/44 |
| | | | | 361/42 |
| 2017/0234918 | A1* | 8/2017 | Tsuchiya | G01R 31/025 |
| | | | | 324/503 |

* cited by examiner

GROUND LOSS DETECTION CIRCUIT

CROSS-REFERENCE TO RELATED APPLICATIONS

This application claims the benefit of U.S. Provisional Application No. 62/190,068, filed Jul. 8, 2015, the disclosure of which is incorporated herein by reference.

BACKGROUND OF THE INVENTION

It is known in vehicle electrical systems that redundant ground lines may be used between a vehicle battery or chassis ground and a vehicle electronic control unit (ECU). This is particularly important in vehicle safety systems such as, for example, vehicle brake systems, vehicle stability control systems, vehicle steering systems, occupant restraint systems and driver assist systems.

SUMMARY OF THE INVENTION

This invention relates to vehicular electrical systems and, in particular, grounding circuits for vehicular electrical systems. The invention concerns a ground loss detection circuit for identifying a faulty ground connection in a vehicle electrical system including a pair of redundant ground lines connected between a vehicle battery/chassis ground and an electronic control unit (ECU). In particular, a first ground line is connected between the battery/chassis ground and a first ECU ground connection, while a second ground line is connected between the battery/chassis ground location and a second ECU ground connection. The ECU includes a common ground associated with selected electronic components included in the ECU. A first shunt component is connected between the first ECU ground connection and the common ground, and a second shunt component is connected between the second ECU ground connection and the common ground. The first and second shunt components can be trace resistors on the ECU circuit board.

The currents through the first and second shunt components are monitored to identify a faulty ground connection in one of the first and second ground lines. When the current level in one of the first and second ground lines is at or near zero, or falls below a predetermined level, a fault is identified. Alternatively, or additionally, when the current levels in the first and second ground lines differ by a predetermined amount (or a relative percentage), a fault is identified.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
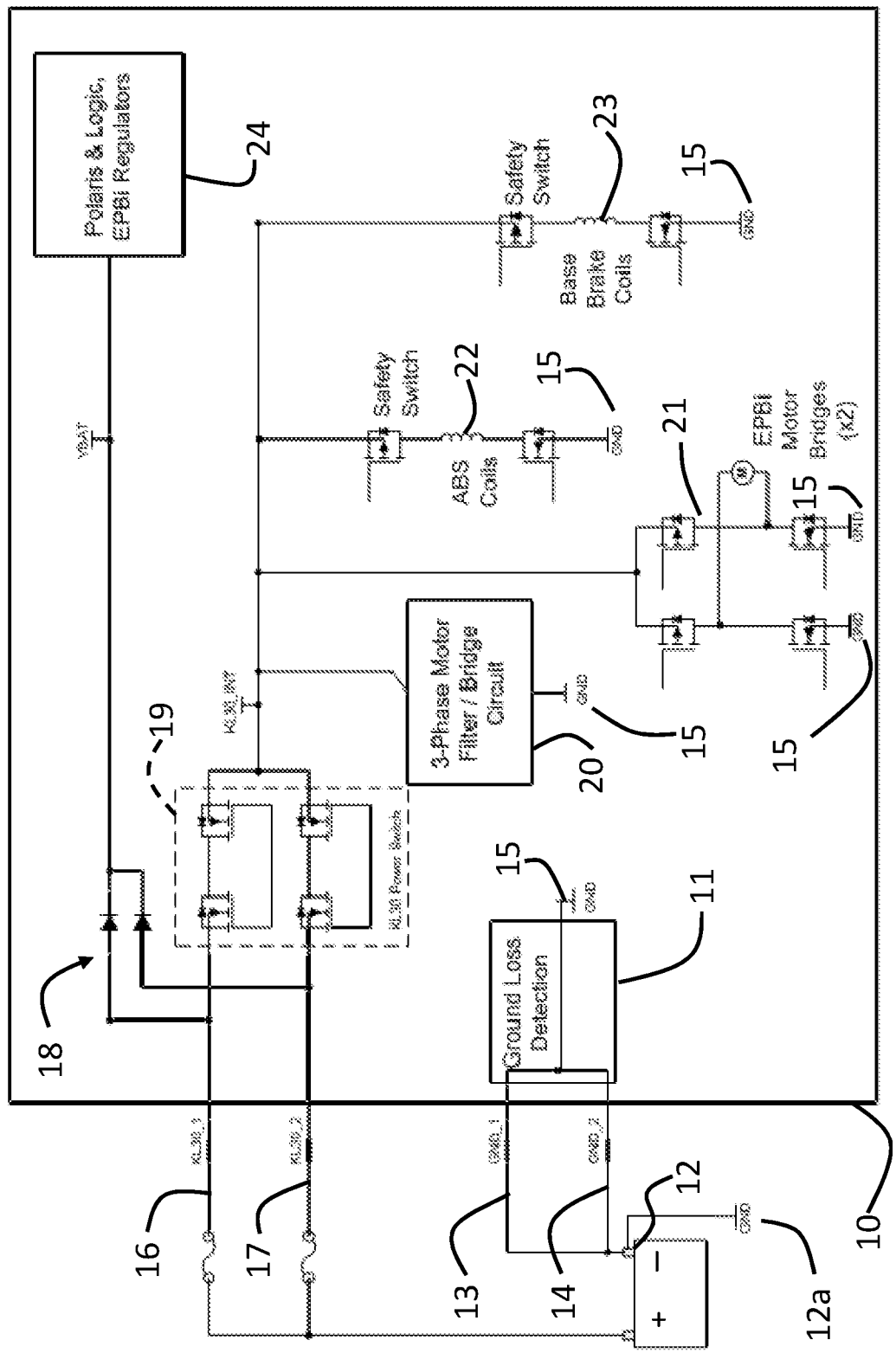
FIG. 1 is a block diagram of one example of a vehicle electrical system having redundant ground lines and which uses the ground loss detection circuit of the invention.

Referring now to the drawings, there is illustrated in FIG. 1 a block diagram illustrating one example of an operating environment for a circuit embodying the features of the present invention. In particular, the exemplary environment shown is a vehicular electronically controlled braking system which includes an electronic control unit (ECU) 10 for monitoring, controlling, actuating or otherwise operating the various electronic components of the system (e.g., sensors, motors, solenoid valve coils, switches, etc.). The invention provides a ground loss detection circuit 11 which is connected to the vehicle battery ground 12 by a first ground line 13 and a second ground line 14. The battery ground is connected to the various GND nodes of the ECU via the ground loss detection circuit 11. Preferably all GND nodes are connected to a single "star point" ground 15. The ground loss detection circuit is operable to monitor and detect a fault (open wire, increased resistance, etc.) in either or both the lines 13 and 14.

In this particular embodiment, the ECU also has repeated power lines 16 and 17 connected to the vehicle battery. Dual diode 18 and dual high side power switch 19 provide a method of management for operating from both of these power lines or just one of them in case of a break in 17 or 18. Some components included in the ECU consist of ABS coils 22 and base brake coils 23. There are also control bridges 20, 21 to drive motors as well as a grouping of processors, logic and power regulators 24. All these devices which make up the ECU for the electronically controlled braking system are referenced to the star point ground 15.

In the event of a break in only one of the ground lines 13 or 14, the ECU electronic components will all remain operable due to the single ground reference 15 which returns to the battery through the unbroken wire. The ground currents will be able to return to the battery ground via the unbroken line, and the ECU will be aware of the fault by the use a detection method used by the ground loss detection circuit 11. While the FIG. 1 embodiment shows two separate line connections (i.e., redundant ground wires) between the vehicle battery ground and the ground loss detection circuit, it will be appreciated that, since the vehicle battery is conventionally connected to a chassis ground at 12a, in some instances one or both lines 13 and 14 could alternatively be connected to a chassis ground.

Figure 2A:
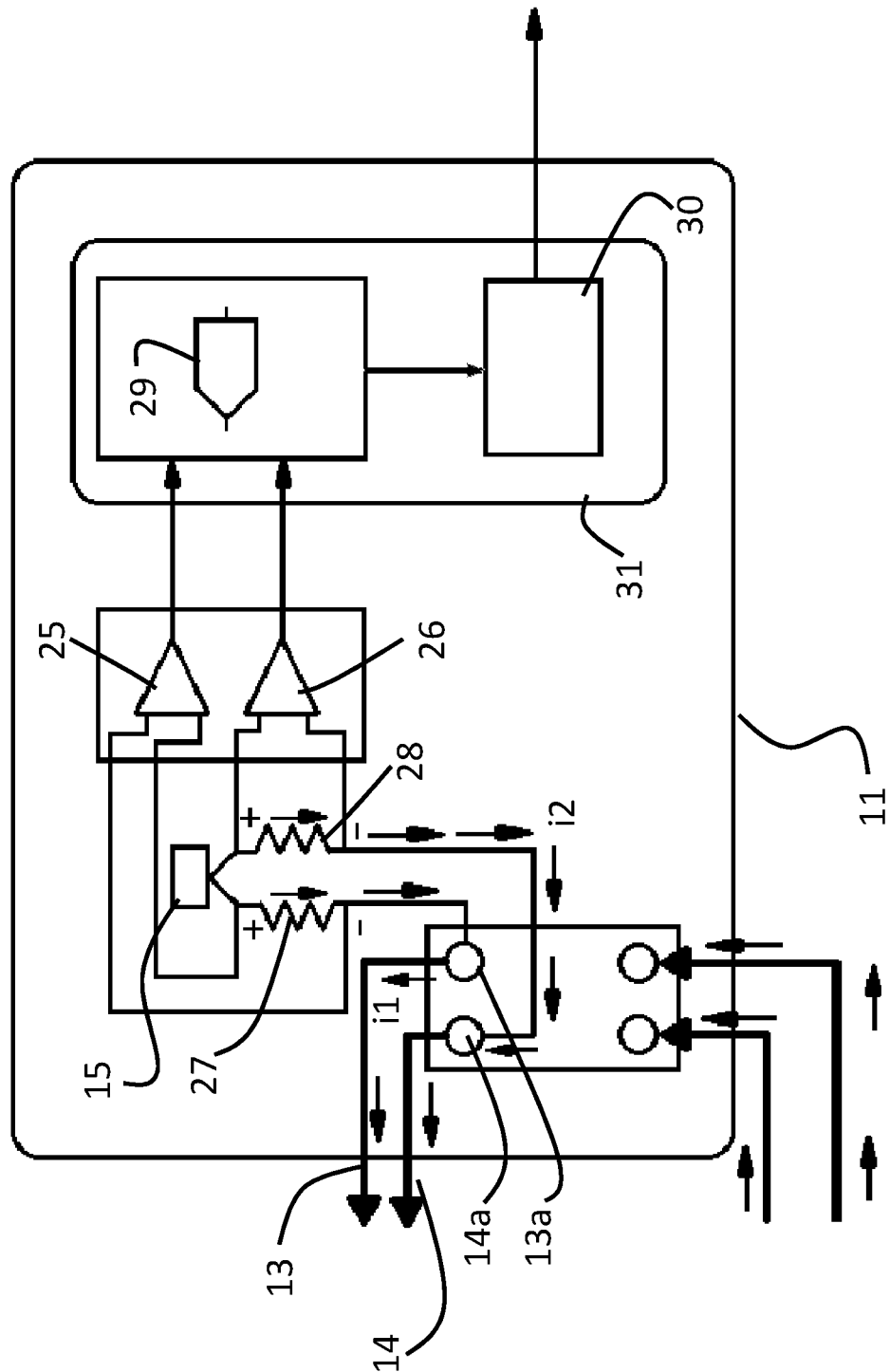
FIG. 2a is simplified diagram showing the components of the ground fault detection circuit when in a normal operation.

FIG. 2a shows more details of the ground loss detection circuit 11. As shown, the ground lines 13 (Ground 1) and 14 (Ground 2) from FIG. 1 are individually connected to ECU ground connections 13a and 14a. The connections 13a and 14a are then connected to the single star point ECU circuit ground 15 by shunt components such as current sensing resistors 27 and 28, respectively. Each resistor can be, for example, a very low resistance trace (e.g., 0.5 milliohms) on the ECU circuit board. The current sense resistors 27 and 28 are balanced such that, when both the ground lines, 13 and 14 are connected properly, the currents i1 and i2 are also balanced. The ground currents through lines 13 and 14 are monitored for faults by providing a separate differential amplifier, 25 and 26, to sense the voltage across each of the current sense resistors, 27 and 28. The outputs of the differential amplifiers are connected to a microcontroller 31 (which includes an A/D converter 29 and a microprocessor 30) which monitors the sensed currents and provides status signals indicating whether either or both the Ground 1 and Ground 2 connections are faulty.

Figure 2B:
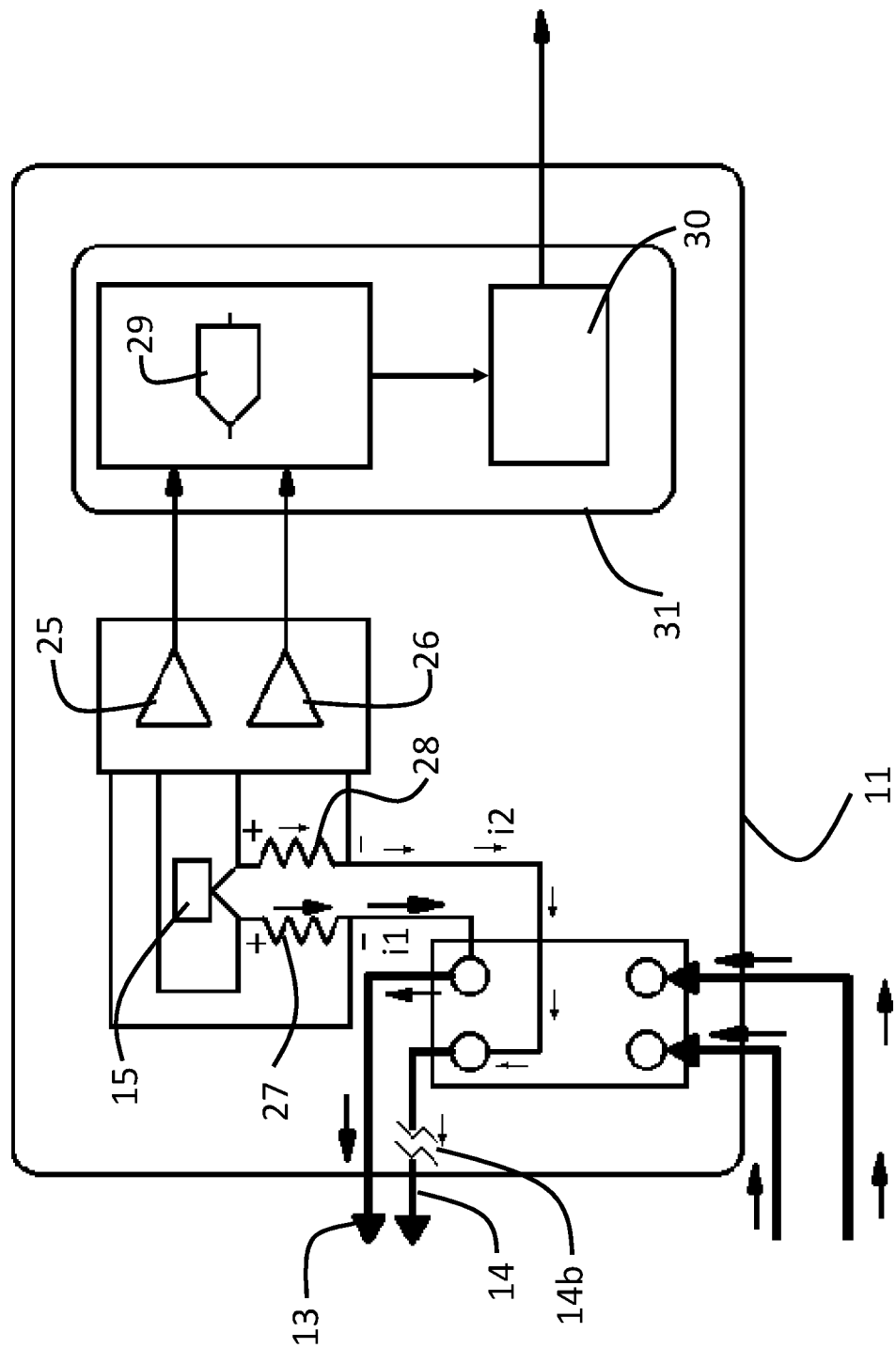
FIG. 2b is similar to FIG. 2a but schematically showing a ground fault condition.

FIG. 2b is similar to FIG. 2a, except that the line 14 is (Ground 2) shown as broken at 14b, such that differential amplifier 26 which monitors the respective current sense resistor 28 detects a zero or reduced level current flow. The microcontroller 31 identifies a faulty Ground 2 connection by reading though its A/D converter 29 that the current i2 is less than the current i1. Under normal operating conditions, currents i1 and i2 should be close to equal, assuming the wire length and resistance of lines 13 and 14 are similar.

Figure 3:
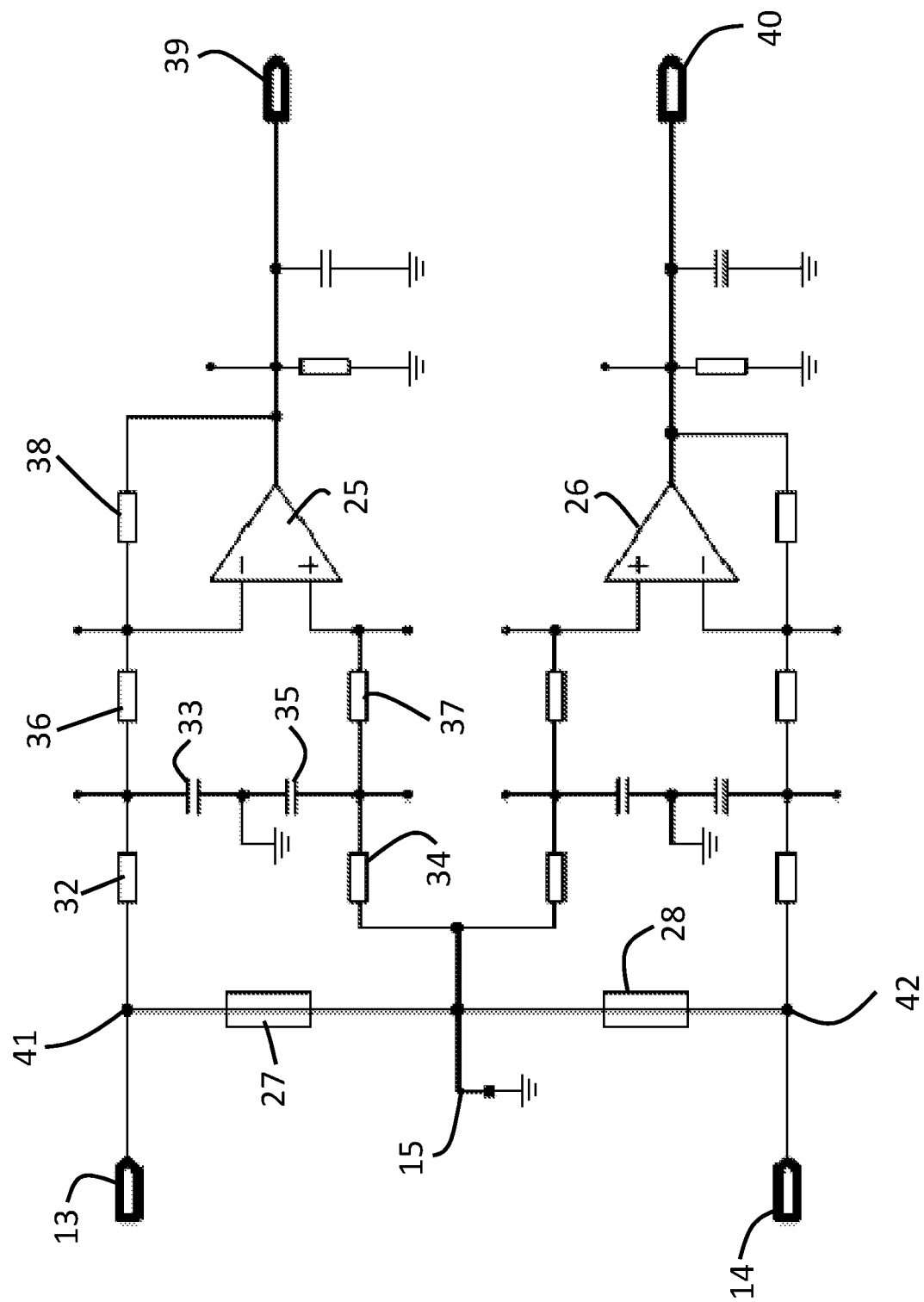
FIG. 3 is an example of one embodiment of a differential amplifier circuit that can be used to monitor the current flow in the redundant ground lines.

FIG. 3 is a circuit schematic which illustrates the detailed circuitry associated with the differential amplifiers of FIG. 2a. The two ground wires connected to the ECU are lines 13 and 14, and the star ground for the ECU circuit is node 15. Similar to FIG. 2a and FIG. 2b, the star ground 15 is distributed to ground connections 13 and 14 though current sense resistors 27 and 28 respectively. Each sense resistor is part of its own differential amplifier circuit. Operational amplifier 25 is designed to amplify the voltage differential across current sense resistor 27. The greater the amount current flowing through resistor 27, the higher the voltage will be at node 41 compared to node 15. Operational amplifier 26 is designed in the same way as amplifier 25, but it will amplify the voltage differential across current sense resistor 28. Series input resistor 32 and capacitor 33 create a low pass filter designed to remove noise, current irregularities, and ESD spikes that may trigger a false fault detection. Series input resistor 34 and capacitor 35 create a low pass filter on the second, non-inverting, terminal of differential amplifier 25. Amplifier 26 also contains a similar low pass filter on each of its input terminals. Both amplifiers have a gain that is associated with how much they increase the small voltage sensed across shunt resistors 27 and 28. In the case of amplifier 25, this gain is defined by input resistors 32, 36, 34, and 37 in combination with feedback resistor 38. Amplifier 26 has a similar configuration of input and feedback resistors. Lines 39 and 40 are the outputs of the differential amplifier which then lead to the analog to digital converter (ADC) 29 of FIG. 2. The ADC will convert the voltage sensed from resistors 27 and 28 into a digital reading that can be interpreted by the microprocessor. The microprocessor will then decide if there is a fault condition in one of the ground wires 13 or 14.

Figure 4:
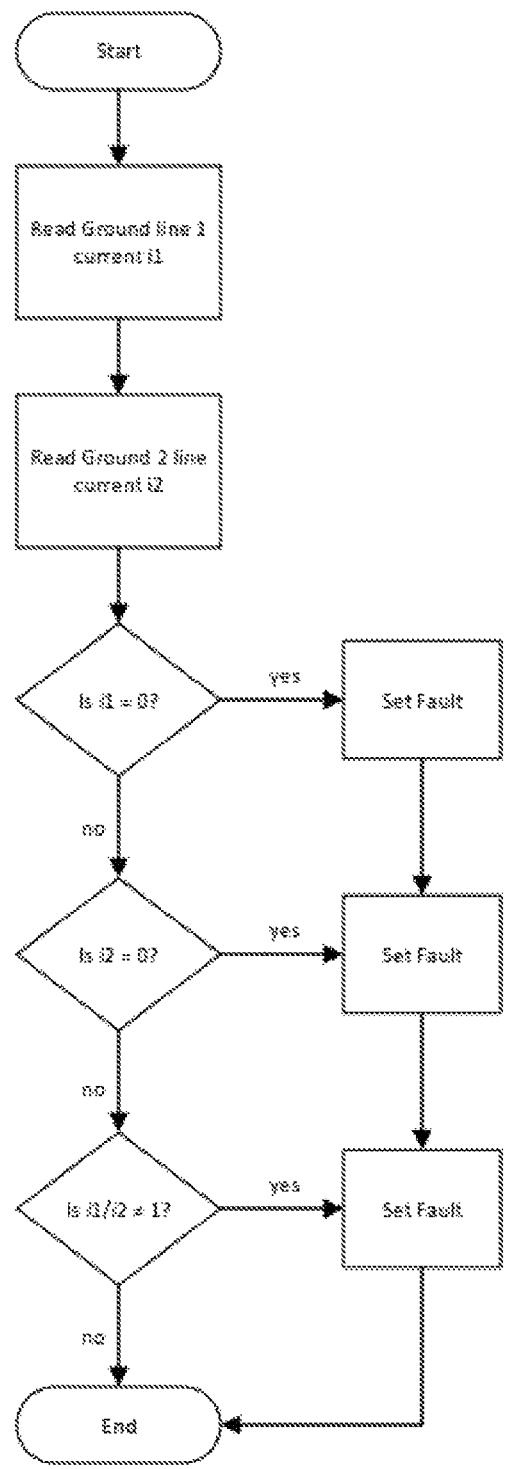
FIG. 4 is a flow diagram of showing one example of a method used to identify a ground fault condition.

FIG. 4 is a flow chart diagram representing the logic involved in detecting a fault condition. The first steps required are to measure the ground currents i1 and i2 through their individual ground lines. In the particular example displayed in FIGS. 2A, 2B, and 3, the ground currents are represented by the voltage across two shunt resistors, one for each ground line. If either one of the two measured currents are at or near 0, or below a defined threshold, then the ground line containing an abnormally reduced flow of current likely has a full or partial discontinuity somewhere in its structure. An additional, or optional, condition to check for is the relationship between the currents in each ground wire. If both wires are functioning properly, and they are designed to have similar impedances, then the total current returning to the battery ground from the ECU should be equally split between both ground lines where i1=i2. If the current i1 is divided by i2, then the result should be somewhere near a value of 1. If the result of this calculation is not close to 1 then there is an abnormality in one of the wires to a point where it has increased resistance, causing an imbalance in the current distribution through both ground lines.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A ground loss detection circuit for a vehicle having a battery connected to an electronic control unit (ECU), the battery having a negative terminal connected to a chassis ground, the circuit comprising:
    a first ground line connected between the negative terminal or chassis ground and a first ECU ground connection;
    a second ground line connected between the negative terminal or chassis ground and a second ECU ground connection;
    a common ground associated with selected electronic components included in the ECU;
    a first shunt component connected between the first ECU ground connection and the common ground;
    a second shunt component connected between the second ECU ground connection and the common ground; and
    a monitoring circuit for sensing a current through each of the first and second shunt components to identify a faulty ground connection in either or both of the first and second ground lines.

2. The ground loss detection circuit of claim 1 wherein the first and second shunt components are resistors.

3. The ground loss detection circuit of claim 2 wherein the resistors are trace resistors located an ECU circuit board.

4. The ground loss detection circuit of claim 1 which includes a first differential amplifier coupler to monitor the current through the first shunt component by sensing the voltage across the first shunt component, and a second differential amplifier coupled to monitor the current through the second shunt component by sensing the voltage across the second shunt component.

5. The ground loss detection circuit of claim 1 wherein the ECU is a component of a vehicle safety system.

6. A method for detecting a ground loss in a vehicle electrical system having a battery connected to an electronic control unit (ECU), the battery having a negative terminal connected to a chassis ground, the vehicle electric system comprising:
    a common ground associated with selected electronic components included in the ECU;
    a first ground line connected between the negative terminal or the chassis ground and the common ground; and
    a second ground line connected between the negative terminal or the chassis ground and the common ground;
    and wherein the method comprises the steps of:
    (a) monitoring a current in the first ground line;
    (b) monitoring a current in the second ground line; and
    (c) identifying a faulty ground connection in response to the currents monitored in steps (a) and (b).

7. The method according to claim 6 wherein the current in step (a) is monitored at a location along the first ground line proximate the common ground.

8. The method according to claim 6 wherein step (c) identifies a faulty ground connection when the current in either the first or second ground line is below a predetermined level.

9. The method according to claim 6 wherein step (c) identifies a faulty ground connection in response to a difference in current levels in the first and second ground lines.

10. The method according to claim 6 wherein step (c) identifies a faulty ground connection in response to a ratio in current levels in the first and second ground lines.

\* \* \* \* \*